United States Patent [19]

Gannett et al.

[11] Patent Number: 4,725,642

[45] Date of Patent: Feb. 16, 1988

[54] MELT-FUSIBLE CO-POLYIMIDE FROM DIAMINE MIXTURE

[75] Inventors: Thomas P. Gannett; Robert J. Kassal; Rolland S. Ro, all of Wilmington, Del.; Julius Uradnisheck, Vienna, W. Va.

[73] Assignee: E. I. Du Pont de Nemours and Company, Wilmington, Del.

[21] Appl. No.: 728,517

[22] Filed: Apr. 29, 1985

[51] Int. Cl.$^4$ .................. C08G 73/10; B32B 27/12
[52] U.S. Cl. ........................... 524/600; 528/125; 528/126; 528/128; 528/172; 528/185; 528/188; 528/189; 528/289; 528/352; 528/353; 428/473.5
[58] Field of Search ............. 528/353, 125, 126, 128, 528/172, 185, 188, 189, 289, 352; 524/600

[56] References Cited

U.S. PATENT DOCUMENTS

| | | | |
|---|---|---|---|
| 3,234,181 | 2/1966 | Olivier | 260/47 |
| 3,845,018 | 10/1974 | Bilow et al. | 260/47 |
| 3,959,350 | 5/1976 | Rogers | 260/47 |
| 4,017,459 | 4/1977 | Onder | 260/47 |
| 4,336,175 | 6/1982 | Gibbs | 524/726 |
| 4,485,140 | 11/1984 | Gannett et al. | 528/353 |
| 4,576,857 | 3/1986 | Gannett et al. | 428/260 |

FOREIGN PATENT DOCUMENTS 58-149916 9/1983 Japan.
1542768 3/1979 United Kingdom.

OTHER PUBLICATIONS

P. Sachindrapal et al., Makromol. Chem., Rapid Commun., 667-670 (1980).

*Primary Examiner*—Harold D. Anderson

[57] ABSTRACT

Melt-fusible copolyimides based on pyromellitic anhydride and two defined classes of aromatic diamines, at least one diamine of each class being incorporated into the polyimide, each diamine class being present in an amount of 10-90 mole percent of the total diamine content (100 mole percent), melt below about 400° C. and can be fabricated into articles, or can be applied to either fibrous or nonfibrous substrates to make prepregs, tapes, etc., which then are shaped into final articles, such as printed circuit boards or aircraft panels.

17 Claims, No Drawings

MELT-FUSIBLE CO-POLYIMIDE FROM DIAMINE MIXTURE

BACKGROUND OF THE INVENTION

This invention relates to certain melt-fusible copolyimides useful in the manufacture of sheets, films, fabricated articles, and composite structures.

For the purpose of the present disclosure and claims, the term "melt-fusible" means that the material can be heated without significant decomposition above its glass transition temperature (Tg), if it is amorphous, or above its crystalline melting point (Tm), if it has crystallinity, and coalesced under pressure. Some of the polyimides of the present invention also are melt-processible, which means that they can be fabricated by conventional melt processing techniques, such as extrusion and injection molding, in which the melt passes through an orifice.

Polyimides are well known to the art and have been described in numerous patents and in scientific literature. A class of melt-fusible polyimides has been reported in the copending application Ser. No. 534,208 of T. P. Gannett and H. H. Gibbs, filed Sept. 21, 1983, now U.S. Pat. No. 4,576,857. In all the polyimides of that application, the acid portion is derived from pyromellitic anhydride. Normally, it is very difficult to make melt-fusible polyimides based on pyromellitic anhydride and an ordinary aromatic diamine; therefore the Gannett et al. application proposes the use of certain specific aromatic diamines containing one or two ether or thioether groups.

Those special diamines, however, are not all readily available, and those that are available tend to be expensive. It thus is desirable to replace at least a portion of such a special diamine with a cheaper, more readily available aromatic diamine.

SUMMARY OF THE INVENTION

According to the present invention, there is now provided a melt-fusible copolyimide consisting essentially of two types of repeating units:

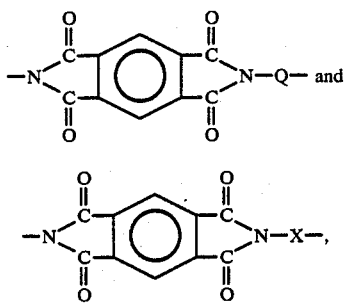

where Q is at least one divalent organic radical represented by the following formula (3):

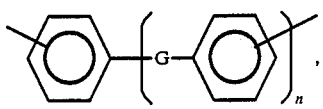

where G is selected from the group consisting of isopropylidene, O, S, $CH_2$, $SO_2$, and CO; and n is 0 or 1; neither one of the terminal bonds being in the ortho position to any other covalent bond; and X is at least one divalent organic radical represented by the following formula (4):

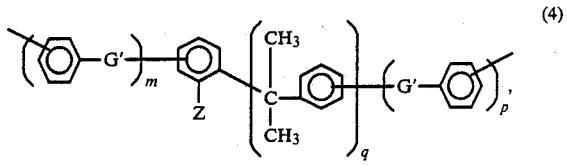

where G' is selected from the group consisting of O, S, $SO_2$, and CO; each of m, p, and q individually is 0 or 1; but, when any one of m, p, and q is not 0, then at least two of m, p, and q are 1; and Z is hydrogen, phenyl, or one of

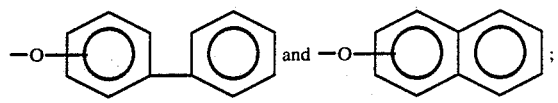

but, when m=p=q=0, Z is not hydrogen and is not in the ortho position with respect to both terminal bonds, and the two terminal bonds are not ortho to each other;

further provided that any aromatic ring other than the aromatic rings carrying the pendant covalent bonds may be substituted by chlorine, so long as the number of chlorine atoms in the molecule does not exceed 4, and the maximum number of chlorine atoms per aromatic ring is 2;

the mole proportion, t, of the repeating units of the type represented by formula (1) being about 10-90%, and the mole proportion, u, of the repeating units represented by formula (2) being about 90-10%, the minimum value of u being such that $u=100-10(m+p)-15(q+n)-0.3(z-1)$ mole %, where z is the formula weight of Z; u always being calculated for X having the smallest formula weight.

DETAILED DESCRIPTION OF THE INVENTION

It can be readily recognized that Q and X in the polyimide fragment formulas (1) and (2) are the divalent radicals remaining after removing both $NH_2$ groups from the corresponding diamines, as represented by formulas (3) and (4), while the acid moiety in each case is pyromellitic acid.

Representative diamines from which the divalent radical Q is derived include the following:
2,2-bis(4-aminophenyl)propane, 4,4'-diaminodiphenyl ether, 4,4'-diaminodiphenylmethane,
1,3-diaminobenzene, 1,4-diaminobenzene,
1,4-diaminodiphenyl sulfone, and 1,4-diaminodiphenyl sulfide.

Representative diamines from which the divalent radical X is derived include, for example, the following:
1,3-bis(3-aminophenoxy)benzene,
2,2-bis(4-aminophenoxyphenyl)propane,
2,2-bis(4-aminophenoxy-3,5-dichlorophenyl)propane,
2-(2,4-diaminophenoxy)biphenyl, and
2-phenyl-1,4-bis(4-aminophenoxy)benzene.

The novel polyimides of the present invention are most conveniently prepared by a two-step process in a polar solvent such, for example, as N,N-dimethylacetamide (sometimes hereafter abbreviated to DMAc).

Other suitable solvents include, for example, hexamethylphosphoramide, dimethyl sulfoxide, N-methyl-2-pyrolidone, and diglyme. In the first step, a polyamic acid is prepared by addition of pyromellitic dianhydride (PMDA) to a solution of the appropriate diamines in the selected solvent. Imidization of the polyamic acid is then carried out by dehydration with a refluxing solution of pyridine in acetic anhydride. Dehydration also can be accomplished by heating the polyamic acid to a high temperature with or without a solvent.

The diamines and pyromellitic anhydride can be used either in a stoichiometric ratio (total diamine to PMDA) or in a nonstoichiometric ratio. When a nonstoichiometric ratio is used, the free end groups preferably should be capped to enhance the melt viscosity stability of the product. When the free end groups are amino groups, which is the preferred alternative, the capping agent may be another anhydride, e.g., phthalic anhydride or an ester such as, e.g., a monoalkyl phthalate. When an excess of PMDA is used to make the polyimide, the end-capping compound can suitably be an amine, e.g., aniline.

The polyimides of the present invention are melt-fusible. They can be compression molded into flexible films or drawn into filaments. The principal use of these polyimides may be, however, in the manufacture of composite sheets by impregnating a fibrous substrate with polyimide precursor solutions. Those composite sheets can be based on a number of such substrates, woven, nonwoven, tow, felt, unidirectional continuous fibers, etc. For many applications, such as various aerospace components, carbon fibers and aramid fibers, which produce light and strong composites, are the most preferred. Other fibers include, among others, glass, boron, and asbestos fibers. The polyimide itself may be filled with reinforcing additives, which may be fibrous, as above, or particulate. Particulate fillers include, for example, carbon and graphite powders, mica, silica, clay, and silicon carbide whiskers. Fiber-reinforced polyimide compositions will usually contain about 5 to about 70 volume % of the additive. For particulate-filled compositions, the range is 5–50 volume %, especially 5–25 volume %.

The usual technique for making composites involves a two-step operation. In the first step a fibrous substrate is impregnated with a solution of polyimide precursors in an appropriate solvent, and the impregnated substrate is heated, usually at an elevated temperature, to reduce the volatiles content, usually to about 25 weight % or less, preferably 10–20%. The partly devolatilized, impregnated fibrous substrate, so-called prepreg, is then used to form the final shaped article, either as a single layer but normally as a multilayer structure, and the polyimide is formed in situ by heating the shaped article to a suitable temperature, for example, 350° C. or higher.

Prepregs contain up to about 70 volume % of fibers (on volatiles-free basis), preferably 40–65%.

Impregnation of a fibrous substrate directly with a molten stoichiometric polyimide is usually not practical because of excessively high melt viscosity of the polyimide even at temperatures approaching its decomposition temperature. However, when an end-capped nonstoichiometric polyimide is employed, impregnation of a fibrous substrate with such a molten polyimide without significant decomposition is entirely feasible. Such impregnated structures (sometimes called cured prepregs) are formed into shaped articles with the aid of equipment permitting localized heating to high temperature, so that the cured prepreg is heat-shaped into the final article in one step. Similarly, a normal "wet" prepreg can be heated to a high enough temperature to cause both devolatilization and curing and then heat-shaped into the final article.

The polyimides of the present invention can be used in such diverse applications as composite sheets which can be formed into articles such as aircraft and autobody panels, appliance housings, printed circuit boards, and missile parts; films, especially films which must be capable of withstanding high temperatures, such as, for example, wire insulation and flexible circuits; coatings, e.g., electrical cable coatings, especially for high temperature applications such as electric motor windings; generator components; and transformer parts.

This invention is now illustrated by certain representative embodiments thereof, where all parts, proportions, and percentages are by weight, unless otherwise indicated. All the units are those adopted by American National Metric Council, Guide SIG-04 (1978).

Pyromellitic dianhydride is commercially available from Veba Huls of the German Federal Republic; however, pyromellitic dianhydride available internally from Du Pont was used.

N,N-Dimethylacetamide, which was used as the solvent in some reactions, was stored over 4 A molecular sieves (activated by heating 4 hours at 450° C. in a stream of nitrogen), and before use was filtered through activity I acidic alumina (to remove dimethylamine). Pyridine was stored over activated 4 A molecular sieves, and in most examples had been distilled from calcium hydride.

All the inherent viscosity measurements were obtained at a concentration of approximately 0.5 g/100 mL of solution at room temperature. The polyamide acid solutions were diluted to the required concentration with DMAc. The polyimide viscosity determinations were carried out at approximately the same concentrations in 100% sulfuric acid. The inherent viscosity of intermediate polyamide acids was kept within the range of about 0.2–3.0 dL/g.

EXAMPLE 1

Stoichiometric Preparation of Melt-Fusible Copolyimide;

Chemical Imidization

In a dried 250 mL flask fitted for mechanical stirring were placed 5.13 g (0.0125 mole) of 2,2-bis(4-aminophenoxyphenyl)propane, 2.475 g (0.0125 mole) of bis(4-aminophenyl)methane and 55 mL of N,N'-dimethylacetamide. After the diamines had dissolved, the solution was cooled in an ice bath; 5.45 g (0.025 mole) of pyromellitic dianhydride was added and rinsed into the flask with 24 mL of N,N-dimethylacetamide. After 15 minutes, the ice bath was removed, and the solution was stirred for 2 hours at room temperature. A small sample (1 mL) was removed, diluted with N,N-dimethylacetamide to 10 mL and found to have an inherent viscosity of 0.52 dL/g. The remainder of the reaction solution was added dropwise to a refluxing mixture of 25 mL of N,N-dimethylacetamide, 6.5 mL of acetic anhydride and 5 mL of pyridine. After completion of the addition, the mixture was refluxed for 2 hours and then cooled to room temperature. The precipitated polyimide was isolated by filtration, washed with N,N-dimethylacetamide and then with acetone and dried overnight at 200°

C. in a vacuum oven. The polyimide was melt pressed at about 400° C. into a tough coherent film.

EXAMPLE 2 (Comparative)

Infusible Copolyimide

In a dried 500 mL flask fitted for mechanical stirring were placed 10.0 g (0.050 mole) of 4,4-diaminodiphenyl ether and 16.35 g (0.056 mole) of 1,3-bis(3-aminophenoxy)benzene, and 150 mL of dried N,N'-dimethylacetamide. Pyromellitic dianhydride (21.8 g, 0.10 mole) was added to the above solution at 20°–25° C. The resulting solution was stirred at room temperature for 2 hours, and 1.78 g (0.012 mole) of phthalic anhydride was added. The reaction mixture was stirred for one additional hour. The polyamide acid was chemically imidized with excess acetic anhydride and pyridine, filtered, washed with water and then with methanol, and dried in a vacuum oven at about 200° C. The copolyimide could not be melt pressed into a coherent film at 400° C. It showed decomposition at higher temperatures (about 450° C.).

EXAMPLE 3

Melt-Fusible Copolyimide

The procedure of Example 2 was carried out for the copolyimide preparation, except that 5.0 g (0.025 mole) of 4,4'-diaminodiphenyl ether and 23.6 g (0.0807 mole) of 1,3-bis(3-aminophenoxy)benzene were used. The copolyimide could be melt pressed into a coherent film.

EXAMPLES 4 THROUGH 19

Melt-Fusible Copolyimides

In each of the Examples 4 through 19, procedures identical to those described in Examples 1 through 3 were carried out for the copolyimide preparation, except that the diamine components were those shown in the following Table. All the copolyimides in these examples were melt pressed into coherent films at 400° C. or below.

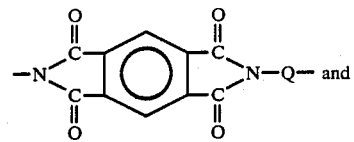

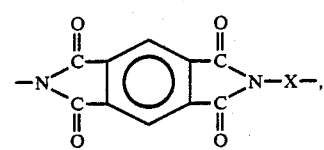

where Q is at least one divalent organic radical represented by the following formula (3):

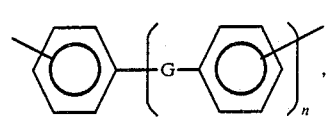

where G is selected from the group consisting of isopropylidene, O, S, $CH_2$, $SO_2$, and CO; and n is 0 or 1; the terminal bonds being in a position other than the ortho position to any other covalent bond; and X is at least one divalent organic radical represented by the following formula (4):

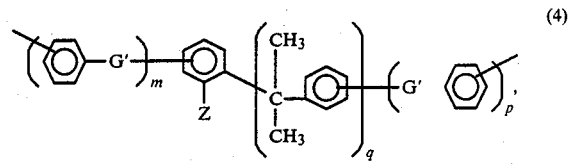

where G' is selected from the group consisting of O, S, $SO_2$, and CO; each of m, p, and q individually is

TABLE

Melt-Fusible Copolyimides
Diamine Components

| Example | Diamine $H_2NXNH_2$ | Mole % | Diamine $H_2NQNH_2$ | Mole % |
|---|---|---|---|---|
| 4 | 1,3-bis(3-aminophenoxy)benzene | 75 | 4,4'-diaminodiphenyl ether | 25 |
| 5 | 1,3-bis(3-aminophenoxy)benzene | 80 | 1,3-diaminobenzene | 20 |
| 6 | 1,3-bis(3-aminophenoxy)benzene | 80 | 1,4-diaminobenzene | 20 |
| 7 | 1,3-bis(3-aminophenoxy)benzene | 50 | 4,4'-diaminodiphenyl methane | 50 |
| 8 | 2,2-bis(4-aminophenoxyphenyl)propane | 50 | 4,4'-diaminodiphenyl ether | 50 |
| 9 | 2,2-bis(4-aminophenoxyphenyl)propane | 50 | 1,3-diaminobenzene | 50 |
| 10 | 2,2-bis(4-aminophenoxyphenyl)propane | 50 | 1,4-diaminobenzene | 50 |
| 11 | 2,2-bis(4-aminophenoxyphenyl)propane | 60 | 4,4'-diaminodiphenyl sulfone | 40 |
| 12 | 2,2-bis(4-aminophenoxy-3,5-dichlorophenyl)propane | 50 | 1,3-diaminobenzene | 50 |
| 13 | 2,2-bis(4-aminophenoxy-3,5-dichlorophenyl)propane | 50 | 4,4'-diaminodiphenyl methane | 50 |
| 14 | 2,2-bis(4-aminophenoxy-3,5-dichlorophenyl)propane | 50 | 4,4'-diaminodiphenyl ether | 50 |
| 15 | 2-(2,4-diaminophenoxy)biphenyl | 50 | 4,4'-diaminodiphenyl ether | 50 |
| 16 | 2-(2,4-diaminophenoxy)biphenyl | 50 | 4,4'-diaminodiphenyl methane | 50 |
| 17 | 2-(2,4-diaminophenoxy)biphenyl | 50 | 1,3-diaminobenzene | 50 |
| 18 | 2-phenyl-1,4-bis(4-aminophenoxy)benzene | 50 | 4,4'-diaminodiphenyl ether | 50 |

We claim:
1. A melt-fusible copolyimide consisting essentially of two types of repeating units

0 or 1; but, when any one of m, p, and q is other than 0, then at least two of m, p, and q are 1: Z is hydrogen, phenyl, or one of

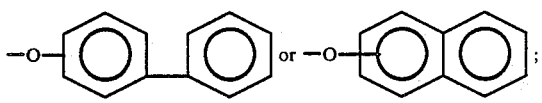

but when m=p=q=zero, Z is other than hydrogen and is in a position other than in the ortho position with respect to both terminal bonds, and the two terminal bonds are in positions other than ortho to each other;

further provided that any aromatic ring other than the aromatic rings carrying the pendant covalent bonds are substituted or may be substituted by cholorine, so long as the number of chlorine atoms in the molecule does not exceed 4, and the maximum number of chlorine atoms per aromatic ring is 2;

the mole proportion, t, of the repeating units of the type represented by formula (1) being about 10–90%, and the mole proportion, u, of the repeating units represented by formula (2) being about 90–10%, the minimum value of u being such that $u=100-10(m+p)-15(q+n)-0.3(z-l)$ mole %, where z is the formula weight of Z; u always being calculated for X having the smallest formula weight.

2. The copolyimide of claim 1 in which Q is the divalent radical remaining after removal of the amine groups from bis(4-aminophenyl)methane, and X is the divalent radical remaining after removal of the amine groups from 2,2-bis(4-aminophenoxyphenyl)-propane.

3. The copolyimide of claim 1 in which Q is the divalent radical remaining after removal of the amine groups from 4,4'-diaminodiphenyl ether, and X is the divalent radical remaining after removal of the amine groups from 1,3-bis(3-aminophenoxy)benzene.

4. A polyimide of claim 1 wherein the divalent radical Q is obtained by removing the amine groups from at least one of the following diamines:
4,4'-diaminodiphenyl ether;
4,4'-diaminodiphenylmethane;
1,3-diaminobenzene;
1,4-diaminobenzene;
1,4-diaminodiphenylsulfone; and
1,4-diaminodiphenyl sulfide.

5. A polyimide of claim 1 wherein the divalent radical X is obtained by removing the amine groups from at least one of the following diamines:
1,3-bis(3-aminophenoxybenzene);
2,2-bis(4-aminophenoxyphenyl)propane;
2,2-bis(4-aminophenoxy-3,5-dichlorophenyl)-propane;
2-(2,4-diaminophenoxy)biphenyl; and
2-phenyl-1,4-bis(4-aminophenoxy)-benzene.

6. A prepreg consisting essentially of a fibrous substrate impregnated with a concentrated solution of a polyimide of claim 1 in an appropriate solvent, the amount of volatiles being about 25 weight percent or less, and the volume proportion of fibers, on volatiles-free basis, being up to about 70%.

7. A prepreg of claim 6 wherein the volatiles content is about 10–20 weight percent.

8. A prepreg of claim 6 wherein the volume proportion of fibers, on volatiles-free basis is about 40–65%.

9. A cured prepreg obtained by impregnating a fibrous substrate with an end-capped nonstoichiometric molten polyimide of claim 1.

10. A precursor solution for making a polyimide of claim 1, consisting essentially of pyromellitic anhydride, a diamine $H_2NQNH_2$, and diamine $H_2NXNH_2$ in an appropriate solvent and in appropriate stoichiometric proportions to form after complete reaction a polyimide of claim 1.

11. A precursor solution for making an end capped polyimide of claim 1, consisting essentially of pyromellitic anhydride, a diamine $H_2NQNH_2$, a diamine $H_2NXNH_2$, and an end-capping agent in an appropriate solvent and in such proportions that there is present in the solution an excess of either a diamine or pyromellitic dianhydride, and the amount of the end-capping agent is about stoichiometrically equivalent to that excess.

12. A filled polyimide composition consisting essentially of a polyimide of claim 1 and a fibrous or particulate filler.

13. A filled polyimide composition of claim 12, wherein the filler is fibrous and its content in the composition is about 5–70 volume percent.

14. A filled polyimide composition of claim 12, wherein the filler is particulate and its content is about 5–50 volume percent.

15. A filled polyimide composition of claim 14, wherein the filler content is about 5–25 volume percent.

16. A fabricated polyimide article made by extrusion, compression, casting, injection, or drawing a polyimide of claim 1.

17. A fabricated filled polyimide article made by compression, extrusion, casting, injection, or drawing a filled polyimide of claim 12.

* * * * *